(12) United States Patent
Parkhurst et al.

(10) Patent No.: US 8,380,146 B2
(45) Date of Patent: Feb. 19, 2013

(54) MULTI-BAND, MULTI-MODE RF TRANSMIT AMPLIFIER SYSTEM WITH SEPARATE SIGNAL PATHS FOR LINEAR AND SATURATED OPERATION

(75) Inventors: Ray Parkhurst, Santa Clara, CA (US); Edward Chen, Fremont, CA (US); William Carrol Mueller, Mountain View, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 486 days.

(21) Appl. No.: 12/650,718

(22) Filed: Dec. 31, 2009

(65) Prior Publication Data

US 2011/0156812 A1    Jun. 30, 2011

(51) Int. Cl.
  *H01Q 11/12* (2006.01)
  *H04B 1/04* (2006.01)
  *H04M 1/00* (2006.01)
(52) U.S. Cl. .............. 455/127.3; 455/552.1; 330/124 R
(58) Field of Classification Search .............. 455/127.1, 455/127.2, 127.3, 127.4, 127.5, 552.1, 553.1, 455/574; 370/311; 375/295, 297; 330/288, 330/289, 296, 124 R, 278, 285
See application file for complete search history.

(56) References Cited

U.S. PATENT DOCUMENTS

| | | | | |
|---|---|---|---|---|
| 5,392,463 | A * | 2/1995 | Yamada | 455/127.4 |
| 6,091,966 | A * | 7/2000 | Meadows | 455/553.1 |
| 6,300,617 | B1 | 10/2001 | Daughton | |
| 6,545,059 | B1 | 4/2003 | Fichou | |
| 6,819,941 | B2 * | 11/2004 | Dening et al. | 455/552.1 |
| 6,970,040 | B1 | 11/2005 | Dening | |
| 7,177,370 | B2 * | 2/2007 | Zhang et al. | 375/297 |
| 7,302,247 | B2 | 11/2007 | Dupuis | |
| 7,376,116 | B2 | 5/2008 | Rozenblitz et al. | |
| 7,376,212 | B2 | 5/2008 | Dupuis | |
| 7,421,028 | B2 | 9/2008 | Dupuis | |
| 7,447,492 | B2 | 11/2008 | Dupuis | |
| 7,545,059 | B2 | 6/2009 | Chen | |
| 7,577,223 | B2 | 8/2009 | Alfano | |
| 7,650,130 | B2 | 1/2010 | Dupuis | |
| 7,683,654 | B2 | 3/2010 | Chen | |
| 7,692,444 | B2 | 4/2010 | Chen | |

(Continued)

FOREIGN PATENT DOCUMENTS

WO    WO 2007/053379 A1    5/2007

OTHER PUBLICATIONS

"Skyworks Introduces Industry's First Multi-band, Multi-mode TDD/TDD Power Amplifier for 4G LTE Applications Next-Generation TEC", FierceWireless, Dec. 18, 2008, 6 pages.

(Continued)

*Primary Examiner* — Quochien B Vuong (57) ABSTRACT

A device includes: an input for receiving an RF input signal having a signal format selected among a plurality of signal formats, including at least one signal format to be linearly amplified, and at least another signal format be amplified in saturation; at least a first and a second output; a first amplification path from the input to the first output that includes a first amplifier that operates in a linear amplification mode with respect to the RF input signal; a second amplification path from the input port to the second output that includes the first amplifier, and a second amplifier that operates in saturated amplification with respect to the RF input signal; and a path selection device that selectively passes the RF input signal through the first amplification path or the second amplification path in response to the selected signal format of the RF input signal.

20 Claims, 7 Drawing Sheets

U.S. PATENT DOCUMENTS

| | | |
|---|---|---|
| 7,719,305 B2 | 5/2010 | Chen |
| 7,737,871 B2 | 6/2010 | Leung et al. |
| 7,738,568 B2 | 6/2010 | Alfano |
| 7,746,943 B2 | 6/2010 | Yamaura |
| 7,821,428 B2 | 10/2010 | Laung |
| 7,856,219 B2 | 12/2010 | Dupuis |
| 7,920,010 B2 | 4/2011 | Chen |
| 8,049,573 B2 | 11/2011 | Alfano |
| 8,061,017 B2 | 11/2011 | Fouquet |
| 8,064,872 B2 | 11/2011 | Dupuis |
| 8,093,983 B2 | 1/2012 | Fouquet |
| 2002/0135236 A1 | 9/2002 | Haigh |
| 2008/0176362 A1 | 7/2008 | Sengupta et al. |
| 2008/0179963 A1 | 7/2008 | Fouquet et al. |
| 2008/0180206 A1 | 7/2008 | Fouquet |
| 2008/0308817 A1 | 12/2008 | Wang et al. |
| 2009/0180403 A1 | 7/2009 | Tudosoiu |
| 2009/0243782 A1 | 10/2009 | Fouquet et al. |
| 2009/0243783 A1 | 10/2009 | Fouquet et al. |
| 2010/0020448 A1 | 1/2010 | Ng et al. |
| 2010/0052120 A1 | 3/2010 | Pruitt |
| 2010/0176660 A1 | 7/2010 | Fouquet |
| 2010/0188182 A1 | 7/2010 | Fouquet et al. |
| 2010/0259909 A1 | 10/2010 | Ho et al. |
| 2010/0328902 A1 | 12/2010 | Ho et al. |
| 2011/0075449 A1 | 3/2011 | Fouquet |
| 2011/0095620 A1 | 4/2011 | Fouquet |

OTHER PUBLICATIONS

Kliger, R., "Integrated Transformer-Coupled Isolation", Mar. 2003.

* cited by examiner

MULTI-BAND, MULTI-MODE RF TRANSMIT AMPLIFIER SYSTEM WITH SEPARATE SIGNAL PATHS FOR LINEAR AND SATURATED OPERATION

BACKGROUND

Radio Frequency (RF) amplifiers are used in a variety of devices, including mobile communications devices such as mobile telephones. In particular, an RF transmit amplifier, also sometimes referred to as a power amplifier (PA) or RF PA, is employed to amplify and transmit an RF signal from a mobile communication device. There are a number of different performance criteria which apply to RF transmit amplifiers in mobile communication devices, including efficiency, power output level, gain, linearity, etc. Depending on the nature of the wireless device and the wireless signal that is being amplified, some of these criteria become more critical than others.

There are an increasing number of wireless communication standards that are employed by wireless communication devices. Current standards include Global System for Mobile communications (GSM), Enhanced Data rates for GSM Evolution (EDGE), Universal Mobile Telecommunications System (UMTS), CDMA2000®, Long Term Evolution (LTE), and new standards are continually being developed. These standards provide for a variety of wireless signal specifications and formats, including different transmit level requirements, different modulation types, etc. For example, GSM employs Gaussian Minimum Shift Keying (GMSK), EDGE employs GMSK and 8-phase shift keying (8-PSK), UMTS employs Code Division Multiple Access (CDMA), etc. These different wireless signals in turn impose different requirements on whatever RF transmit amplifier is employed to transmit each of these wireless signals.

In particular, some of these wireless signals (8-PSK, CDMA) need to be amplified with a linear amplification characteristic, while for other signals (GMSK), the RF transmit amplifier can be operated in a saturated mode (i.e., in gain compression) without negatively affecting the transmit Bit Error Rate. In general, operating an RF amplifier in saturation can provide certain benefits over linear amplification. For example, operation in saturation is generally more efficient than linear operation, and therefore for a given RF output signal level, a saturated RF amplifier can reduce power consumption compared to a linear RF amplifier supplying the same output level. Also, in general an active device that provides a given output level in saturated mode can be made smaller than an active device that provides the same output level in linear operation. However, saturated amplification is inappropriate for certain signal formats because saturation can cause signal distortion that is undesirable for certain signals. This presents a set of design tradeoffs for a single RF amplifier that attempts to process some signals for linear amplification, and other signals for saturated amplification.

Furthermore, the various wireless communication standards operate in a variety of different frequency bands which can be different from country to country.

Also, some wireless communication devices exercise some form of control over the output power of the RF transmit amplifier. In particular, when the mobile communication device is operating somewhat far away from a base station, the device may operate in a "high power" mode wherein the RF output power level is set at or near its maximum value. On the other hand, when the mobile communication device is operating somewhat close to a base station, the device may operate in a "low power" mode wherein the RF output power level is set at a reduced level. Variations of this "dual-mode" operation are possible, for example, where the current battery voltage level and the remaining battery capacity are also taken into consideration when switching between operating modes. When the RF power amplifier is switched into the "low power" mode, it consumes less current from the battery than when it operates in the "high power" mode. Therefore, when the RF power amplifier is switched to the "low power" mode, the mobile communication device is able to conserve battery power and thereby extend the required time between charges.

So it is seen that there are a variety of different modes and different frequency bands in which RF transmit amplifiers operate in wireless communication devices.

Meanwhile, there is a desire for one wireless device to support several different wireless communication standards.

However, equipping a single wireless communication device to transmit a variety of different wireless signal formats in a variety of different frequency bands places a number of constraints on the RF transmit amplifier system. In particular, it is difficult to provide a single RF transmit amplifier that is optimized for transmitting all of the various wireless signals in all of the corresponding frequency bands.

One example of this increased integration, and the associated technical challenges imposed on RF transmit amplifiers, is the evolution of GSM wireless communication devices.

The first second generation (2G) devices in Europe were single-Band GSM wireless communication devices using the GMSK signal format operating in the 890-915 MHz GSM band (P-GSM-900). These devices typically used duplexers between the antenna, and the transmit and receive signals.

Subsequently, GSM was expanded to the 880-915 MHz Extended GSM band (E-GSM-900). The extended band was provided to improve capacity. However, the increase in bandwidth produced a more complicated RF transmit amplifier design. Also, the closer spacing between transmit and receive channels caused higher transmit noise in the receive band.

The development of dual-band devices added the 1710-1785 MHz DCS-1800 frequency band to the GSM-900 band. As a result, two separate RF transmit amplification chains were required, one for each band. The requisite doubling of components, especially filters, was undesirable given the expectations of simultaneous reductions in the size of wireless devices. Also, in these dual-band wireless devices duplexers were replaced with transmit/receive (T/R) switches.

Tri-Band GSM devices added the 1850-1910M Hz PCS band, wherein a GMSK signal is transmitted in any of the three frequency bands. Adoption of GSM in the United States PCS band expanded the role of the high-band RF transmit amplifier for dual-band applications. The bandwidth of the high band RF transmit amplifier increased from 4% to 11%, complicating the RF transmit amplifier design. Also, the difficulty of switching input transmit bandpass filters forced a more stringent specification on output noise power from the transmit amplifier.

Adoption of GSM in the United States expanded to the 824-849 MHz cellular band, leading to Quad-Band devices employing GMSK in four different frequency bands. As a result, the bandwidth requirements for the low-band RF transmit amplifier increased from 3% to 10%, complicating the RF transmit amplifier design. More stringent noise power specifications were also required.

Initial adoption of EDGE (which employs GMSK and 8-PSK) by Europe and eventually by the U.S. and other nations forced wireless communication device manufacturers to create the first multi-band multi-mode (MBMM) wireless communication devices. Several variants of RF transmit amplification solutions exist for these devices, including a 2-mode RF transmit amplifier, a single-mode polar RF transmit amplifier, and a single-mode linear RF transmit amplifier.

The 2-mode RF transmit amplifier operates in a saturated mode for GMSK, and in a linear mode for EDGE. In general, 2-mode RF transmit amplifiers are optimized for GMSK signals, and are sub-optimal for EDGE signals.

Single-mode polar RF transmit amplifiers offer software-programmable radio functionality and also address multi-burst problems that cause a failure of the GSM system power/time mask, and are seen on earlier devices that combine the GMSK and EDGE signals in a single RF transmit amplifier.

Single-mode linear RF transmit amplifiers are also software programmable and improve linearity for EDGE signals, at the expense of GMSK performance.

In parallel with the development of GSM/EDGE systems, competing CDMA-based systems (n-CDMA and W-CDMA) were developed. GSM and n-CDMA offer the best support for low-bandwidth voice applications, while W-CDMA best supports the burgeoning market for wireless data for mobile internet access, file sharing, productivity applications, and peer-to-peer data communications. EDGE can support both voice and data, but neither optimally as the current draw is too high for voice, while the bit rate too slow for data.

One system cannot adequately support all applications, forcing wireless communication device manufacturers to support several modes in a given device which can be selected for optimal performance based on the immediate application (e.g., GMSK or n-CDMA for voice; W-CDMA for data; EDGE for voice or data—based on capacity or network availability). Convolved with the need to cover virtually all available bands, what is developing are true MBMM wireless communication devices. Expanding upon the evolution of GSM, these MBMM wireless communication devices represent the next evolutionary phase, providing operation with GMSK/EDGE/W-CDMA signals, worldwide frequency band coverage, etc. In particular, what is generally desired is quad-band operation with GMSK/EDGE signals, together with operation with W-CDMA signals in from one to five (or more) bands, depending on the desired flexibility of the wireless device. Also, n-CDMA support in the W-CDMA paths is sometimes desired for further interface flexibility.

Several potential options exist to address the need for RF transmit amplification in these MBMM wireless devices. These options include: (1) a single RF transmit amplifier; (2) a single RF transmit amplifier with a DC-DC converter and a distribution switch; (3) dual RF transmit amplifiers with a distribution switch and a DC-DC Converter; (4) four RF transmit amplifiers; and (5) four RF transmit amplifiers with a distribution switch on the linear ports.

However, all of these solutions present their own problems or drawbacks.

A single RF transmit amplifier (Option 1) requires an amplifier operating over an extremely wide bandwidth and able to address the power level differential between low bands and high bands, and between W-CDMA and GMSK. These requirements make this potential solution untenable. This configuration also would require a tunable duplexer, which are not commercially available, for multi-band UMTS support.

With a single RF transmit amplifier with a DC-DC converter and a distribution switch (Option 2), the DC-DC converter allows adjustment of RF transmit amplifier output power according to the operating band and modulation. However, the difficulty of applying the DC-DC converter at high currents in dynamic conditions without spurious emissions or time mask problems complicates the DC-DC implementation, and the DC-DC converter adds cost and consumes circuit board area. The distribution switch solves the issue of tunable duplexer availability, but the switch is not desirable for GMSK or EDGE signals due to increased transmit chain loss.

With dual RF transmit amplifiers with a distribution switch and a DC-DC Converter (Option 3), the bandwidth requirement placed on each RF transmit amplifier is reduced to practical levels. However, this configuration has high GSM or EDGE transmit chain losses due to the distribution switch.

With four RF transmit amplifiers (Option 4), the GSM or EDGE vs. W-CDMA power level discrepancy problem can be eliminated by transmitting the different signals through separate, optimized RF transmit amplifier chains. This approach also eliminates the need for transmit switch for GSM or EDGE signals. However, there is a cost increase due to having four separate RF transmit amplifiers, and this configuration is limited to one band per UMTS RF transmit amplifier.

Having four RF transmit amplifiers with a distribution switch on the linear ports (Option 5) allows multi-band support for linear ports similar to option (2) for each RF transmit amplifier. However, again, there is a cost increase due to having four separate RF transmit amplifiers.

What is needed, therefore, is an RF signal amplification device that can be separately optimized for amplifying and transmitting wireless signals conforming to a variety of different standards in a variety of different frequency bands.

SUMMARY

In an example embodiment, an apparatus comprises: an input port for receiving an RF input signal; a first RF amplification device having an input for being connected to the input port, having an output, and having a first gain, the first RF amplification device being configured to operate in a linear amplification mode in response to the RF input signal; a second RF amplification device having an input for being connected to the input port, having an output, and having a second gain, the second RF amplification device being configured to operate in a linear amplification mode in response to the RF input signal; a third RF amplification device having an input and having an output, the third RF amplification device being configured to operate in a saturated amplification mode in response to an amplified RF input signal received from one of the first and second RF amplification devices; and a signal distribution device having one or more inputs connected to the outputs of the first and second RF amplification devices for receiving the amplified RF input signal, and having a plurality of outputs including a first output connected to the input of the third RF amplification device and one or more second outputs that are not connected to the input of the third RF amplification device, the signal distribution device being configured to selectively connect one of its inputs to one of its outputs in response to a control signal; wherein when the RF input signal requires saturated amplification by the apparatus, the control signal causes the signal distribution device to connect one of its inputs to its first output that is connected to the input of the third RF amplification device, and when the RF input signal requires linear amplification by the apparatus, the control signal causes the signal distribution device to connect one of its inputs to one of its second outputs.

In another example embodiment, a device comprises: an input port for receiving an RF input signal having a signal format selected from among a plurality of signal formats, wherein the signal formats include at least one signal format requiring linear amplification by the device, and at least one signal format requiring saturated amplification by the device; at least a first output and a second output; a first amplification path from the input port to the first output that includes one or more first RF amplifiers that operate in a linear amplification mode with respect to the RF input signal; a second amplification path from the input port to the second output that includes at least one of the first RF amplifiers, and a second RF amplifier that operates in a saturated amplification mode with respect to the RF input signal; and a path selection device configured to selectively pass the RF input signal through the first amplification path when the signal format of the RF input signal is a linear amplification signal format, and to selectively pass the RF input signal through the second amplification path when the signal format of the RF input signal is a saturated amplification signal format.

In yet another example embodiment, a method of amplifying an RF signal, the method comprising receiving an RF input signal having a signal format selected among a plurality of signal formats, wherein the signal formats include one or more linear amplification signal formats to be linearly amplified, and one or more saturated amplification signal formats to be amplified in saturation; whenever the signal format of the RF input signal belongs to one of the linear amplification signal formats, amplifying the RF input signal with one or more first RF amplifiers operating in a linear amplification mode; and whenever the signal format of the RF input signal belongs to one of the saturated amplification signal formats, amplifying the RF input signal with one of the first RF amplifiers, and a second RF amplifier operating in a saturated amplification mode.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

As used herein, the term "radio frequency" or "RF" pertains to VHF, UHF, SHF, microwave and even millimeter wave frequencies to the extent that technology permits the devices and circuits disclosed herein to be fabricated and operated at such frequencies. Also, unless otherwise noted, when a first device is said to be connected or coupled to a second device, this encompasses cases where one or more intermediate devices may be employed to connect the two devices to each other. In contrast, when a first device is said to be directly connected or directly coupled to a second device, this encompasses cases where the two devices are connected together without any intervening devices except any necessary electrical wires. As used herein, "approximately" means within 10%, and "substantially" means at least 75%.

Figure 1:
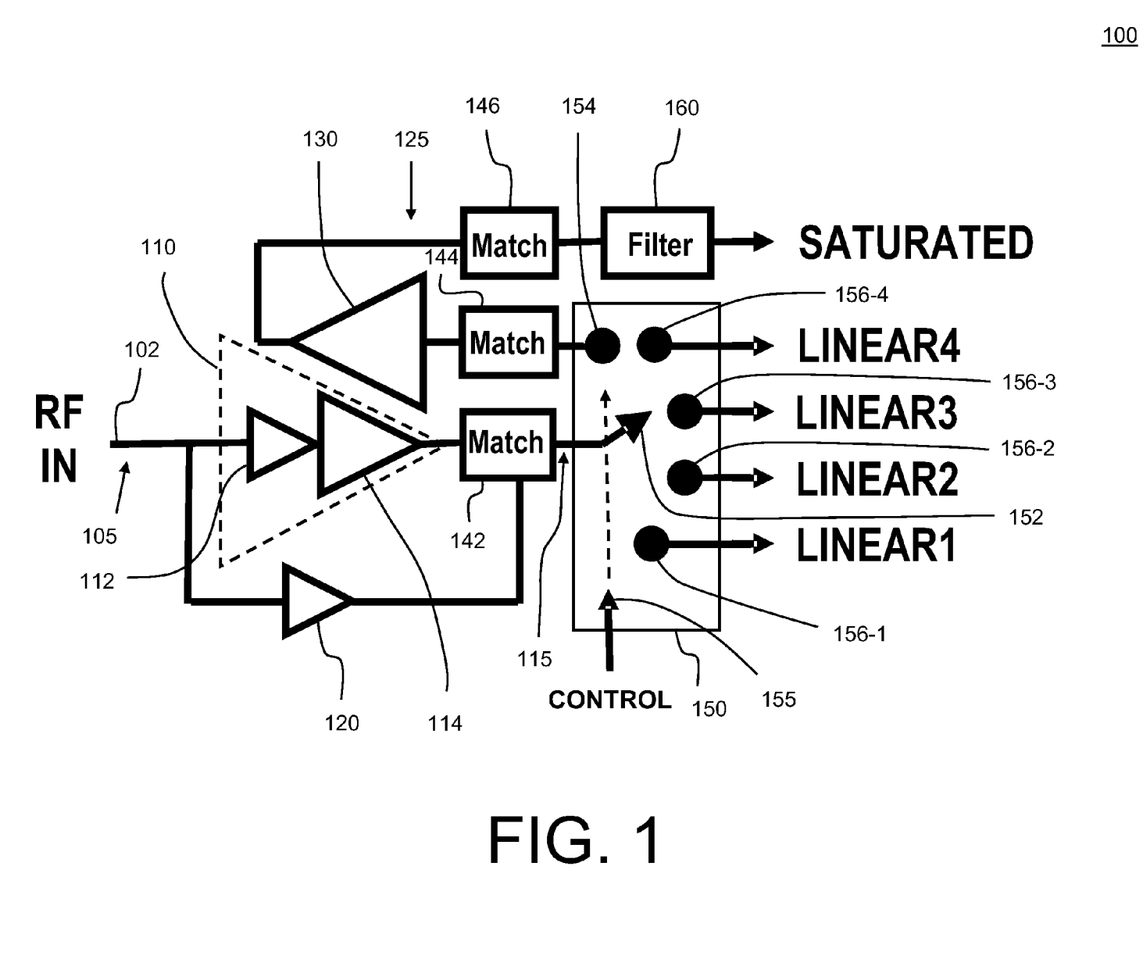
FIG. 1 shows a functional block diagram of one embodiment of a radio frequency (RF) transmit amplifier system.

FIG. 1 shows a functional block diagram of a first embodiment of a radio frequency (RF) transmit amplifier system 100. RF transmit amplifier system 100 includes a first RF amplification device 110, a second RF amplification device 120, a third RF amplification device 130, a signal distribution device 150. RF transmit amplifier system 100 also includes impedance matching networks 142, 144 and 146, and a transmit filter 160.

In RF transmit amplifier system 100, first RF amplification device 110 includes a first RF amplifier 112 and a second RF amplifier 114. In stating that first RF amplification device 110 includes two separate RF amplifiers 112 and 114, one can consider that an "RF amplifier" constitutes one distinct stage with a signal input and a signal output and one active element, or interconnected group of active elements, providing signal gain from the input to the output. Although first RF amplification device 110 in RF transmit amplifier system 100 beneficially includes a series of two RF amplifiers, in some alternative implementations it is possible that the first RF amplification device may include only a single RF amplifier, or may include three or more RF amplifiers in series. Although second RF amplification device 120 in RF transmit amplifier system 100 beneficially includes a single RF amplifier, in some alternative implementations it is possible that the second RF amplification device 120 may include two or more RF amplifiers in series. Beneficially, in some embodiments the signal gain of first RF amplification device 110 is substantially greater than the gain of second RF amplification device 120. For example, in one embodiment, the gain of first RF amplification device 110 may be 28 dB and the gain of second RF amplification device 120 may be 16 dB. In some alternative implementations, one of the first and second RF amplification devices 110 and 120 may be omitted.

Signal distribution device 150 includes an input terminal 152, a first output terminal 154, a plurality of second output terminals 156-1 through 156-4, and a control or switching terminal 155. Beneficially, there is no functional difference between first output terminal 154 and second output terminals 156-1 through 156-4, but they are labeled separately to more clearly distinguish the signals that pass through these terminals, as will be explained in greater detail below. In RF transmit amplifier system 100 there are four second terminal 156-1 through 156-4, however in other implementations the number of second terminals 156 may be different, depending on the number of modes and signal formats to be amplified by RF transmit amplifier system 100, as will be described in greater detail below. In RF transmit amplifier system 100, signal distribution device 150 is implemented as a single-pole, multi-throw switch.

In some embodiments, one or more additional amplification devices besides first and second RF amplification devices 110 and 120 may be connected between input port 102 and input terminal 152 of signal distribution device 150.

Some or all of impedance matching networks 142, 144, and 146 and transmit filter 160 may be eliminated or reconfigured in any particular implementation, and/or may be incorporated into other elements such as RF amplification devices 110, 120 and/or 130 depending on the input and output impedances of various elements in RF transmit amplifier system 100. For example, depending on the nature of first and second RF amplification devices 110 and 120 and signal distribution device 150, and the impedances these devices present at their various ports, in some implementations impedance matching network 142 may be eliminated and in its place, one or more impedance matching networks may be provided at the output terminals of signal distribution device 150. It should be understood that a variety of different configurations of impedance matching strategies and networks may be employed without departing from the principles of RF transmit amplifier system 100 as described herein.

Operation of RF transmit amplifier system 100 will now be described in the context of a wireless communication device that includes RF transmit amplifier system 100 for amplifying an RF input signal and providing an amplified RF output signal to an antenna (e.g., via a duplexer) of the wireless communication device.

Input port 102 receives an RF input signal 105 to be amplified.

RF input signal 105 has a selected signal format among a plurality of different signal formats supported by RF transmit amplifier system 100. As used herein, the signal format pertains to characteristics such as modulation type, transmission coding, bandwidth, data rates, spectral occupancy, etc., but specifically not including the amplitude, power, or level of the signal. In some embodiments, the signal formats may include some or all of the following signal formats: a Gaussian Minimum Shift Keying (GMSK) signal format for GSM signals; an Enhanced Data rates for GSM Evolution (EDGE) signal format, including GMSK and 8-Phase Shift Keying (8-PSK) modulation, for EDGE signals; a Universal Mobile Telecommunications System (UMTS) signal format, including narrowband Code Division Multiple Access (n-CDMA) and wideband CDMA (W-CDMA); a Long Term Evolution (LTE) signal format; a High-Speed Uplink Packet Access (HSUPA) format; and an Evolved High-Speed Packet Access (HSPA+) format. In various embodiments, the signal formats may be grouped into: (1) linear amplification signal formats—including, e.g., EDGE, UMTS, HSUPA, HSPA+ and LTE—which require linear amplification by RF transmit amplifier system 100; and (2) saturated amplification signal formats—including, e.g., GMSK—which are intended to be amplified in saturation by RF transmit amplifier system 100.

As used herein "linear amplification" means amplification of a signal where the level of the amplified output signal is proportional, or approximately proportional, to the level of the input signal, where the amplifier is capable of delivering more power into its load. In contrast, as used herein "saturated amplification" means amplification of a signal where the level of the output signal deviates significantly from being a linear function of the level of the input signal when the level of input signal is increased. As used herein, significant deviation means that the output signal is at least 1 dB less than what it would be if the amplifier was linearly amplifying the input signal. In other words, as used herein saturated amplification means amplification where the amplification device is operating at or above its 1 dB gain compression point. Of course it is understood that whether or not an RF amplifier is in a linear amplification mode, or in a saturated amplification mode, depends on the level of the RF input signal provided thereto.

RF input signal 105 is provided from RF input port 102 to the inputs of first and second RF amplification devices 110 and 120.

Beneficially, only one of first and second RF amplification devices 110 and 120 is activated or turned on at any time. For example, in some embodiments, when a higher RF transmit signal level is desired (e.g., because the wireless communication device is located relatively far away from a base station), then first RF amplification device 110 may be turned on, and second RF amplification devices 120 may be turned off, such that only first RF amplification device 110 amplifies RF input signal 105 to produce an amplified RF input signal 115. In contrast, when a lower RF transmit signal level is desired (e.g., because the wireless communication device is located relatively close to a base station), then first RF amplification device 110 may be turned off, and second RF amplification device 120 may be turned on, such that only second RF amplification device 120 amplifies RF input signal 105 to produce amplified RF input signal 115.

First and second RF amplification devices 110 and 120 may be activated/deactivated by enabling/disabling a power supply voltage (e.g., a DC supply voltage) from supplying current to first or second RF amplification devices 110 and 120. This may be accomplished, for example, by one or more switches (not shown) in first and second RF amplification devices 110 and 120. Beneficially, by disabling or turning off the current supply to whichever of the first and second RF amplification devices 110 and 120 is not being used at any given time, the power consumption of RF transmit amplifier system 100 may be reduced. Alternatively, in some implementations an input switching apparatus (not shown in FIG. 1) may be provided to selectively switch RF input signal 105 between the inputs of first and second RF amplification devices 110 and 120.

First and second RF amplification devices 110 and 120 are each configured such that when activated, they linearly amplify RF input signal 105 to produce an amplified RF input signal 115. More specifically, for the given signal level (e.g., −10 dBm) of RF input signal 105 that is supplied to first RF amplification device 110 or second RF amplification device 120, first and second RF amplification devices 110 and 120 are each configured to operate in a linear amplification mode, below the point of amplifier saturation.

Amplified RF input signal 115, output by one of first and second RF amplification devices 110 and 120, is supplied to input terminal 152 of signal distribution device 150.

Signal distribution device 150 receives a CONTROL signal at control terminal 155 that causes signal distribution device 150 to selectively connect its input terminal 152 to one of the first output terminal 154 and the plurality of second output terminals 156-1 through 156-4. In particular, depending on the operating mode of the wireless communication device and the corresponding signal format of RF input signal 105, the CONTROL signal causes signal distribution device 150 to provide amplified RF input signal 115 to the correct output port for subsequent processing by downstream transmission elements (e.g., duplexers, filters, multiplexers, antenna, etc.) of the wireless communication device.

For illustration only, in one example: the LINEAR1 path connected to output terminal 156-1 may correspond to a signal processing path for a first UMTS (U1) signal; the LINEAR2 path connected to output terminal 156-2 may correspond to a signal processing path for a second UMTS (U2)

signal; the LINEAR3 path connected to output terminal 156-3 may correspond to a signal processing path for a third UMTS (U3) signal; the LINEAR4 path connected to output terminal 156-4 may correspond to a signal processing path for an EDGE signal; etc. Amplified RF input signal 115 may be provided via a selected signal processing path (e.g., LINEAR1, LINEAR2, etc.) as an RF transmit signal to an antenna (e.g., via a duplexer) of the wireless communication device.

Significantly, when RF input signal 105 has a saturated amplification signal format (e.g., GMSK) as described above, then CONTROL signal at control terminal 155 causes signal distribution device 150 to selectively connect its input terminal 152 to first output terminal 154 to thereby supply amplified RF input signal 115 to the input of third RF amplification device 130.

Beneficially, third RF amplification device 130 is configured to be selectively activated and deactivated depending on the signal format of RF input signal 105, and consequently whether the signal path that includes third RF amplification device 130 is selected by signal distribution device 150. Third RF amplification device 130 may be activated/deactivated by enabling/disabling a power voltage (e.g., a DC supply voltage) from supplying current to third RF amplification device 130. This may be accomplished, for example, by one or more switches (not shown) in third RF amplification device 130. Beneficially, by disabling or turning off the current supply to third RF amplification device 130 when it is not being used at any given time, the power consumption of RF transmit amplifier system 100 may be reduced.

Third RF amplification device 130 is configured such that when activated, it amplifies amplified RF input signal 115 to produce an amplified RF output signal 125. More specifically, for the given signal level (e.g., 27 dBm) of amplified RF input signal 115 that is supplied to third RF amplification device 130, third RF amplification device 130 is configured to operate in a saturated amplification mode, as described above. As noted earlier, saturated amplification can provide certain benefits over linear amplification. For example, operation in saturation is generally more efficient than linear operation, and therefore for a given RF output signal level, a saturated RF amplifier can reduce power consumption compared to a linear RF amplifier supplying the same output level. Also, in general an active device that provides a given output level in saturated mode can be made smaller than an active device that provides the same output level in linear operation. However, saturated amplification is inappropriate for certain signal formats because saturation can cause signal distortion that is undesirable for certain signals.

So third RF amplification device 130 further amplifies amplified RF input signal 115 in a saturated amplification mode to produce an amplified RF output signal 125. Amplified RF output signal 125 is then provided through matching filter 146 and RF filter 160, as necessary, to produce an RF transmit signal which may be provided to an antenna (e.g., via a duplexer) of the wireless communication device.

Beneficially, RF transmit amplifier system 100 can be separately optimized for linear amplification and for saturated amplification. In particular, RF transmit amplifier system 100 provides a first amplification path for linear amplification when RF input signal 105 has a format (e.g., EDGE, UMTS and LTE signal formats) that should be linearly amplified, and a second amplification path for saturated amplification when RF input signal 105 has a format (e.g., GMSK) that should be amplified in saturation. The first amplification path includes first and/or second RF amplification devices 110 and 120 that operate in a linear amplification mode with respect to RF input signal 105. The second amplification path includes one of the devices 110 and 120 that operate in either a linear or a saturated mode, and third amplification device 130 that operates in a saturated amplification mode with respect to RF input signal 105.

In particular, in RF transmit amplifier system 100, linear signals (e.g., EDGE, UMTS and LTE signals) are amplified by first and/or second RF amplification devices 110 and 120, with first RF amplification device 110 being employed for a high power mode, and second RF amplification device 120 being employed for a low power mode. As noted above, the specific implementation of first and second RF amplification devices 110 and 120 is flexible and could employs any of several topologies that offer two or more gain and/or power modes. Signal distribution device 150 allows path selection to band-specific duplexers or directly to a front-end switch (not shown in FIG. 1) of a wireless communication device in which RF transmit amplifier system 100 is employed. Signal distribution device 150 has an additional throw which connects to third RF amplification device 130 which operates as a saturated output stage (e.g., for GMSK signals). Beneficially, third RF amplification device 130 has its own output matching and filtering networks 146 and 160, and its output connects to the front-end switch directly, without passing through signal distribution device 150, thereby minimizing losses. GMSK mode operation is possible with either: (1) first and third RF amplification devices 110 and 130 active; or (2) second and third RF amplification devices 120 and 130 active, depending on gain and output power requirements.

Figure 2:
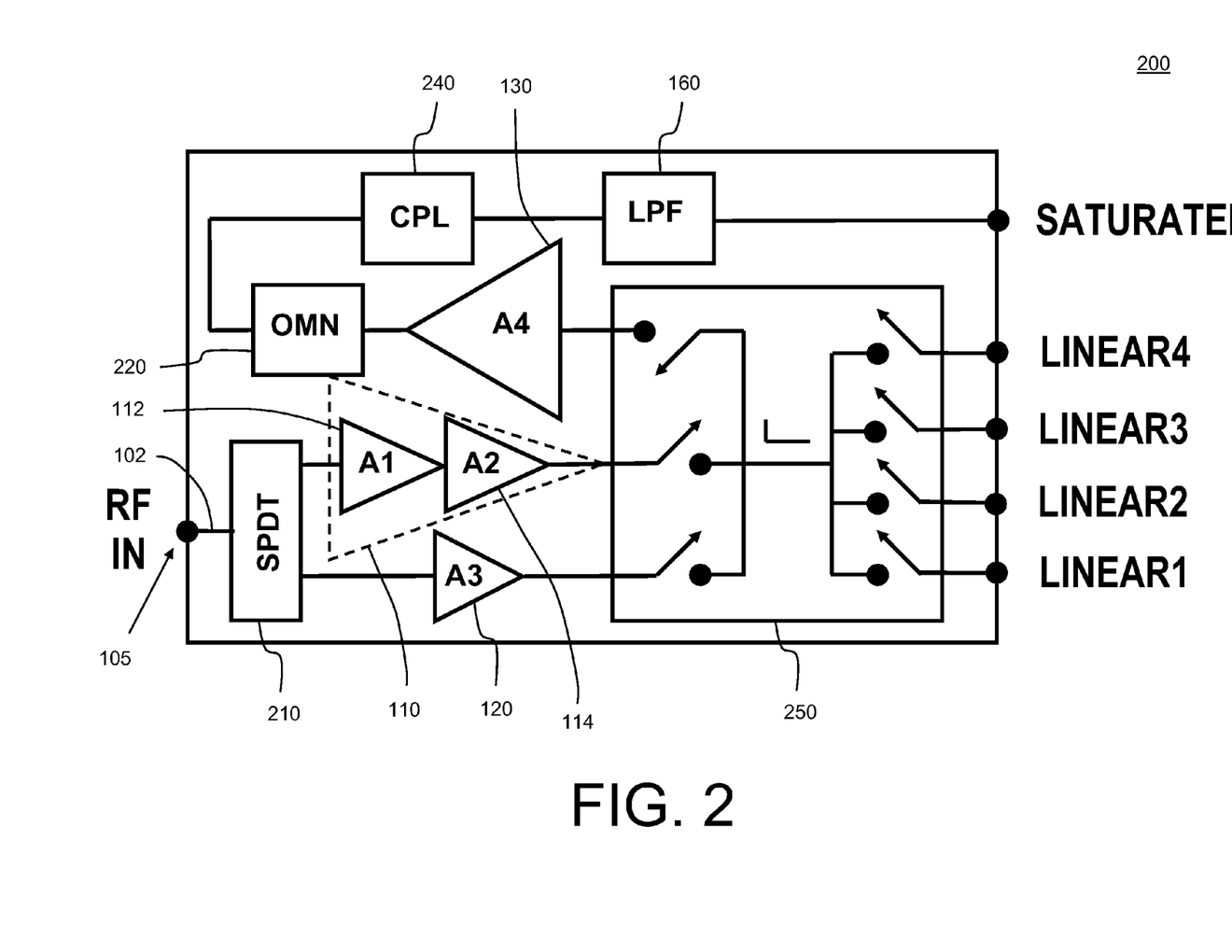
FIG. 2 shows a schematic diagram of a second embodiment of an RF transmit amplifier system.

FIG. 2 shows a schematic diagram of a second embodiment of an RF transmit amplifier system 200. Reference numbers in FIG. 2 that are similar to those in FIG. 1 denote similar elements, and the configuration and operation of those elements in RF transmit amplifier system 200 are similar to what is described above with respect to RF transmit amplifier system 100, with the following differences. RF transmit amplifier system 200 includes single-pole, double-throw (SPDT) switch 210 for selectively connecting RF input signal 105 and RF input port 102 with the input of first RF amplification device 110 or second RF amplification device 120. Also, in RF transmit amplifier system 200 signal distribution device 250 is implemented with a double-pole, multi-throw switch having two inputs, each connected to a corresponding one of the outputs of first RF amplification device 110 and second RF amplification device 120. Beneficially, signal distribution device 250 also includes a coupler as shown in FIG. 2. Also in RF transmit amplifier system 200, the amplified RF output signal 125 from RF amplifier 130 is provided to output matching network 220 and then coupler 240 before passing to RF filter 160.

In operation, one or more control signals are applied to signal distribution device 250 to connect a selected one of the outputs from first RF amplification device 110 or second RF amplification device 120 to one of the outputs of signal distribution device 250, depending on the signal format of RF input signal 105 and the amplification to be provided to that signal.

In some embodiments, one or more additional amplification devices besides first and second RF amplification devices 110 and 120 may be connected between input port 102 and signal distribution device 250. In that case, signal distribution device 250 may comprise a multi-pole, multi-throw switch.

Figure 3:
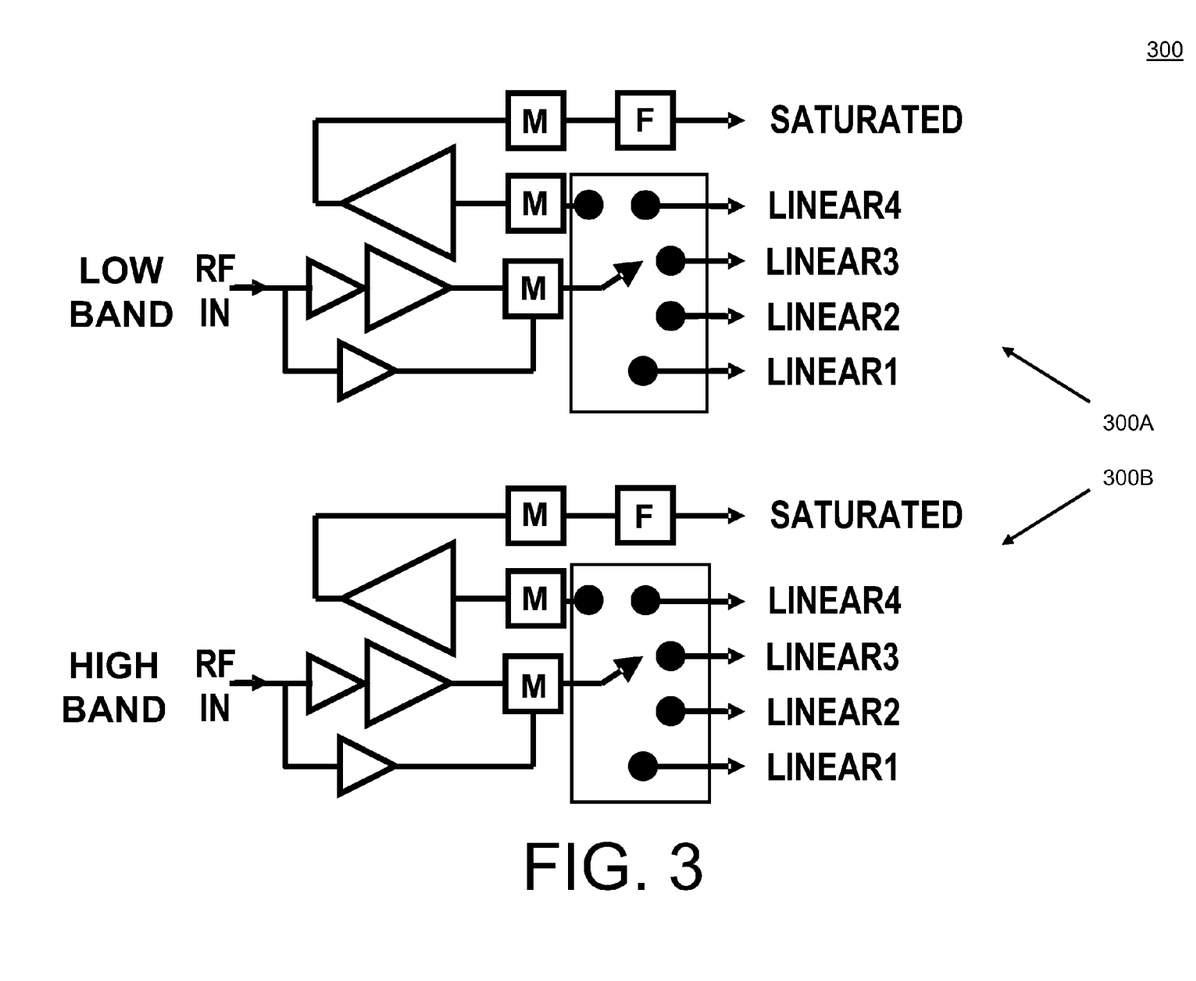
FIG. 3 shows a schematic diagram of a third embodiment of an RF transmit amplifier system.

FIG. 3 shows a schematic diagram of a third embodiment of an RF transmit amplifier system 300. RF transmit amplifier system 300 is a multi-band implementation which includes a first RF transmit amplifier subsystem 300A and a second RF transmit amplifier subsystem 300B. In various embodiments, each of the first and second RF transmit amplifier subsystems 300A and 300B may have the same architecture and configuration as RF transmit amplifier system 100 of FIG. 1 or RF transmit amplifier system 200 of FIG. 2. Beneficially, RF transmit amplifier subsystem 300A receives a first RF input signal when the wireless communication device is operating in one or more lower frequency bands, and RF transmit amplifier subsystem 300B receives a second RF input signal when the wireless communication device is operating in one or more higher frequency bands. For example, in some embodiments RF transmit amplifier subsystem 300A may operate with frequencies below 1400 MHz, and RF transmit amplifier subsystem 300B may operate with frequencies above 1400 MHz.

Figure 4:
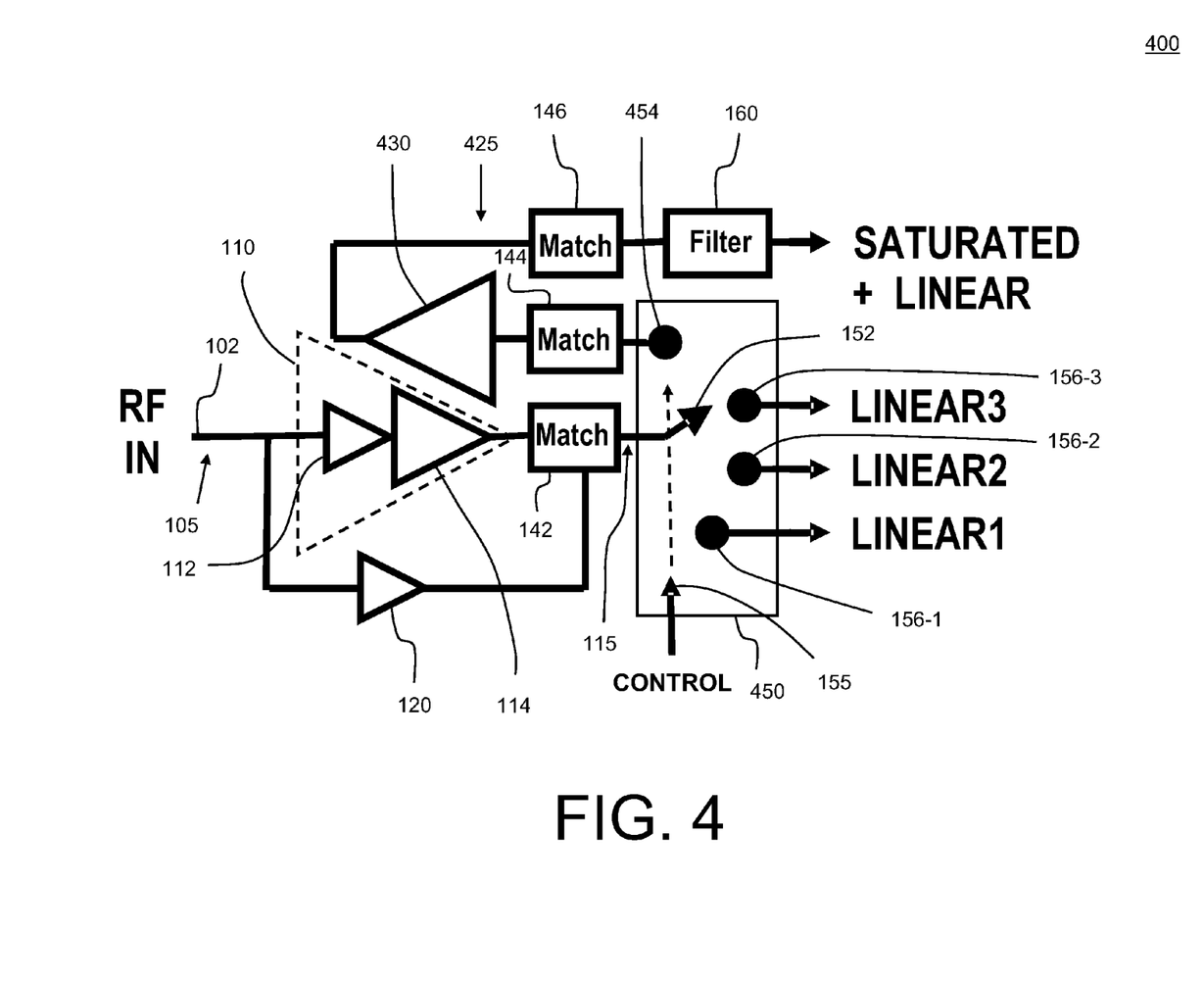
FIG. 4 shows a schematic diagram of a fourth embodiment of an RF transmit amplifier system.

FIG. 4 shows a schematic diagram of a fourth embodiment of an RF transmit amplifier system 400 that combines a saturated amplification path and one linear amplification path (e.g. for GMSK+EDGE functionality) to reduce the number of switch throws in signal distribution device 450. In particular, in RF transmit amplification system 400, RF amplifier 430 amplifies in either a saturated amplification mode, or a linear amplification mode, depending on the signal format of input signal 105. Reference numbers in FIG. 4 that are similar to those in FIG. 1 denote similar elements, and the configuration and operation of those elements in RF transmit amplifier system 400 are similar to what is described above with respect to RF transmit amplifier system 100, with the following differences. For illustration, consider a case where RF input signal may be a GSM signal with GMSK modulation, an EDGE signal, or a UMTS signal with CDMA modulation. In that case, RF amplifier 430 amplifies in a saturated amplification mode when RF input signal 105 is a GMSK signal, and operates in a linear amplification mode when input signal 105 is an EDGE signal, so that amplified RF output signal 425 may be either a linearly amplified EDGE signal, or a saturated GMSK signal. Accordingly, signal distribution device 450 responds to the CONTROL signal at control terminal 155 to connect input terminal 152 to first output terminal 454 when RF input signal 105 is a GMSK signal or an EDGE signal, and to connect input terminal 152 to a corresponding one of the second output terminals 156-1, 156-2 156-3 when RF input signal 105 is a UMTS signal, an LTE signal, etc.

Figure 5:
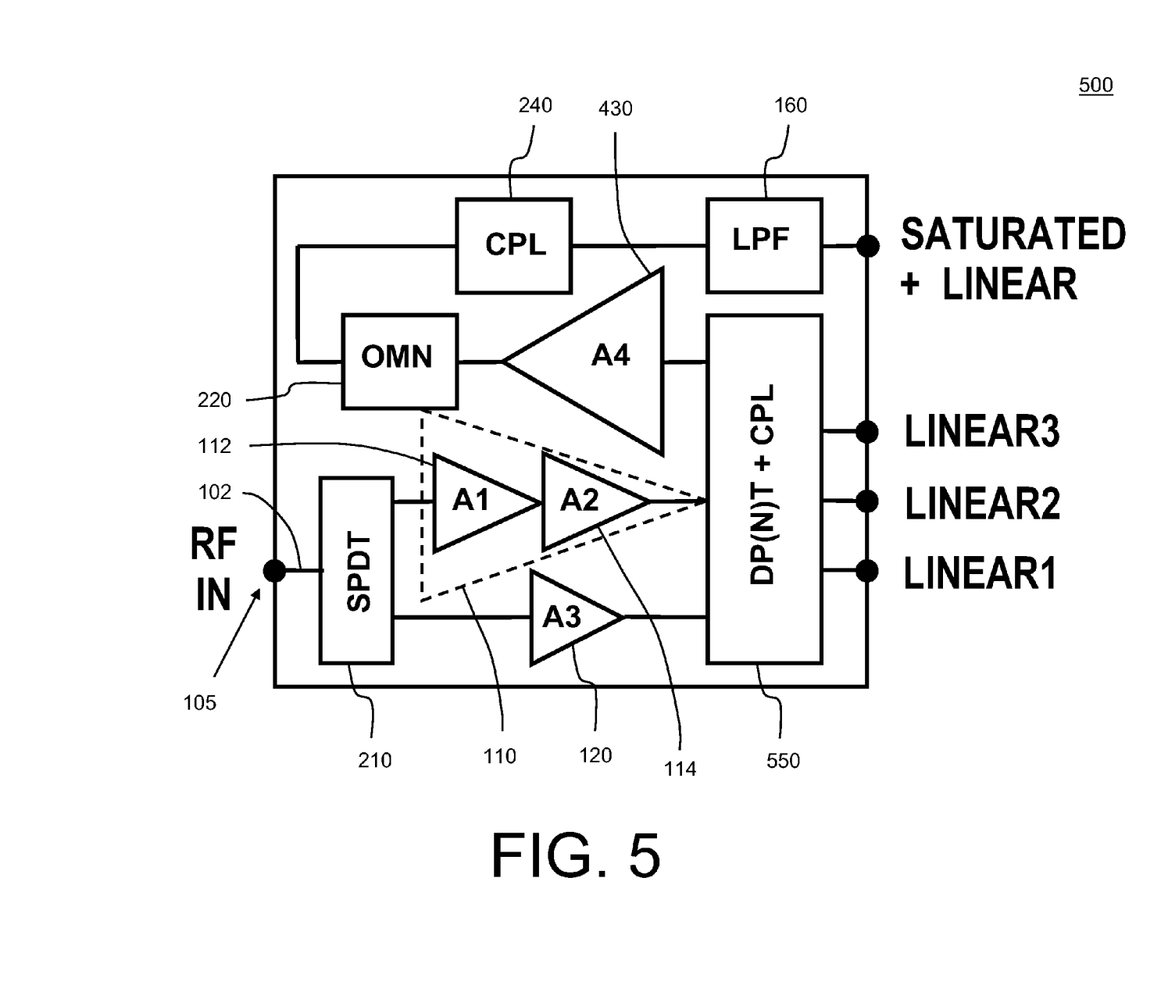
FIG. 5 shows a schematic diagram of a fourth embodiment of an RF transmit amplifier system.

FIG. 5 shows a schematic diagram of a fifth embodiment of an RF transmit amplifier system 500. Reference numbers in FIG. 5 that are similar to those in FIGS. 1-4 denote similar elements, and the configuration and operation of those elements in RF transmit amplifier system 500 are similar to what is described above with respect to RF transmit amplifier system 400, with the following differences. RF transmit amplifier system 200 includes single-pole, double-throw (SPDT) switch 210 for selectively connecting RF input signal 105 and RF input port 102 with the input of first RF amplification device 110 or second RF amplification device 120. Also, in RF transmit amplifier system 500 signal distribution device 550 is implemented with a double-pole, multi-throw switch having two inputs, each connected to a corresponding one of the outputs of first RF amplification device 110 and second RF amplification device 120. Beneficially, signal distribution device 250 also includes a coupler (see, for example, FIG. 2). Also in RF transmit amplifier system 500, the amplified RF output signal 425 from RF amplifier 430 is provided to output matching network 220 and then coupler 240 before passing to RF filter 160.

In operation, one or more control signals are applied to signal distribution device 550 to connect a selected one of the outputs from first RF amplification device 110 or second RF amplification device 120 to one of the outputs of signal distribution device 550, depending on the signal format of RF input signal 105 and the amplification to be provided to that signal.

In some embodiments, one or more additional amplification devices besides first and second RF amplification devices 110 and 120 may be connected between input port 102 and signal distribution device 250. In that case, signal distribution device 250 may comprise a multi-pole, multi-throw switch.

Figure 6:
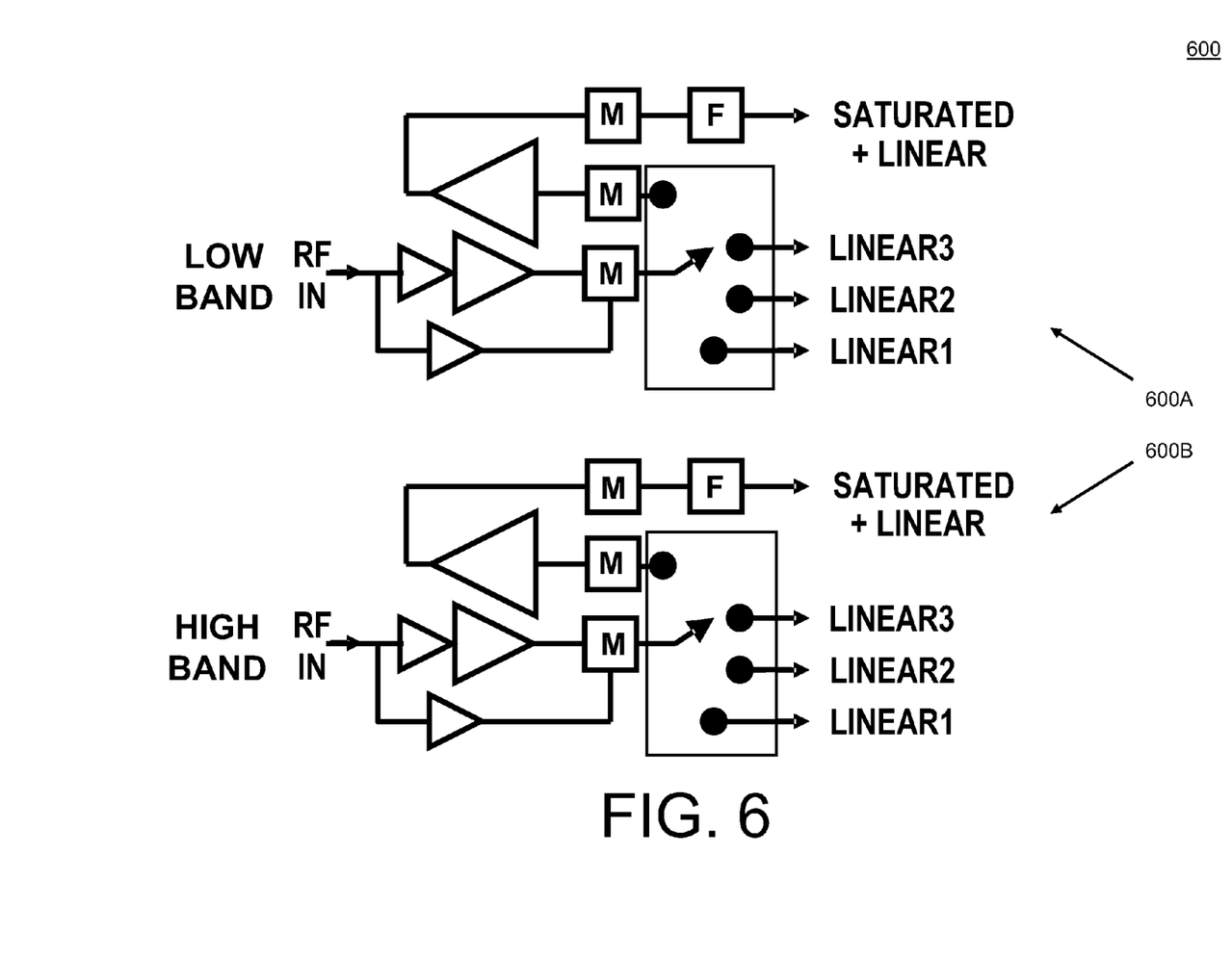
FIG. 6 shows a schematic diagram of a fourth embodiment of an RF transmit amplifier system.

FIG. 6 shows a schematic diagram of a sixth embodiment of an RF transmit amplifier system 600. RF transmit amplifier system 600 includes a first RF transmit amplifier subsystem 600A and a second RF transmit amplifier subsystem 600B. In various embodiments, each of the first and second RF transmit amplifier subsystems 600A and 600B may have the same architecture and configuration as RF transmit amplifier system 400 of FIG. 4 or RF transmit amplifier system 500 of FIG. 5.

Figure 7:
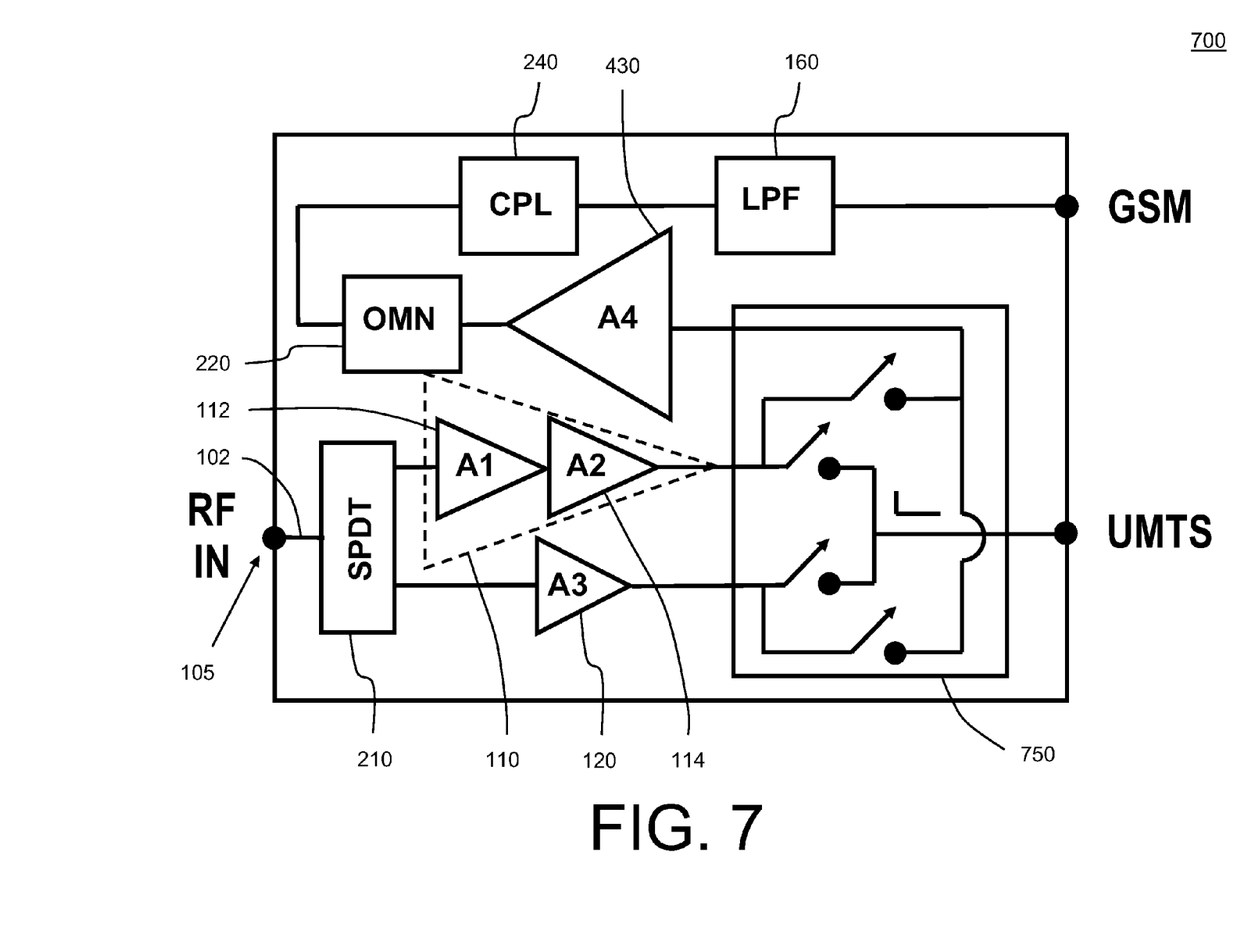
FIG. 7 shows a schematic diagram of a fifth embodiment of an RF transmit amplifier system.

FIG. 7 shows a schematic diagram of a seventh embodiment of an RF transmit amplifier system 700. Reference numbers in FIG. 7 that are similar to those in FIGS. 1-5 denote similar elements, and the configuration and operation of those elements in RF transmit amplifier system 700 are similar to what is described above with respect to RF transmit amplifier system 500, with the following differences. In RF transmit amplifier system 700 there is only a single path for GSM signals (GMSK+EDGE), and a single path for a single UMTS band. In that case, signal distribution device 550 of FIG. 5 can be replaced with a signal distribution device 750 having a particularly beneficial configuration as shown in FIG. 7. One benefit of the arrangement of signal distribution device 750 shown in FIG. 7 is that each of the signals paths—the GSM signal path and the UMTS signal path—only includes one RF switch, and therefore insertion losses for the signals can be reduced compared to, for example, the configuration shown in FIG. 2 where all signal paths include two RF switches.

One or more embodiments of RF transmit amplifier systems as described above may provide one or more of the following features: it may eliminate a power discrepancy problem between GSM/EDGE vs. W-CDMA that is present when a single RF transmit amplifier is employed, as described in Option 1 in the Background section above; it may not require the DC-DC converter of Options 2 & 3 in the Background section above; it may not require four separate amplifiers as in Options 4 & 5 in the Background section above; it may not require the GMSK signals to pass through the distribution switch as in Options 2 & 3 in the Background section above; and it allows independent optimization of linear amplification mode and saturated amplification mode, unlike Options 1, 2 & 3 in the Background section above.

All options that combine GMSK and EDGE signals in a single RF transmit amplifier can potentially suffer from multi-burst power error that causes a failure of the GSM system power/time mask. This occurs due to varying temperature of the RF transmit amplifier during the burst, causing the RF transmit amplifier gain to vary. Various embodiments of an RF transmit amplification system as described above address this by passing the GMSK signal through a different output device than that which is employed for the EDGE signal. However, routing GMSK and EDGE signals through separate paths requires additional switch complexity (added switch poles), so an alternative implementation as described above combines GMSK and EDGE signals onto one path.

As a result of their architectures, embodiments of RF transmit amplifiers may provide a combination of lower system cost through elimination of the need for DC-DC converter; lower component cost and simpler system implementation compared with an approach with four RF transmit amplifiers;

higher performance compared with options where the amplified GMSK RF output signal is passed through one or distribution switches; and higher performance compared with solutions combining the amplification of linear and saturated signals in a single RF amplifier.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. An apparatus, comprising:
an input port for receiving an RF input signal;
a first RF amplification device having an input for being connected to the input port, having an output, and having a first gain, the first RF amplification device being configured to operate in a linear amplification mode in response to the RF input signal;
a second RF amplification device having an input for being connected to the input port, having an output, and having a second gain, the second RF amplification device being configured to operate in a linear amplification mode in response to the RF input signal;
a third RF amplification device having an input and having an output, the third RF amplification device being configured to operate in a saturated amplification mode in response to an amplified RF input signal received from one of the first and second RF amplification devices; and
a signal distribution device having an input connected to the outputs of the first and second RF amplification devices for receiving the amplified RF input signal, and having a plurality of outputs including a first output connected to the input of the third RF amplification device and one or more second outputs that are not connected to the input of the third RF amplification device, the signal distribution device being configured to selectively connect its input to one its outputs in response to a control signal;
wherein when the RF input signal is to be amplified in the saturated amplification mode by the apparatus, the control signal causes the signal distribution device to connect its input to its first output that is connected to the input of the third RF amplification device, and when the RF input signal is to be amplified in a linear mode by the apparatus, the control signal causes the signal distribution device to connect its input to one of its second outputs.

2. The apparatus of claim 1, wherein the first RF amplification device comprises two RF amplifiers connected in series with each other.

3. The apparatus of claim 1. wherein the signal distribution device comprises a single-pole, multi-throw switch.

4. The apparatus of claim 1, wherein the signal distribution device comprises a double-pole, multi-throw switch.

5. The apparatus of claim 1, wherein the signal distribution device comprises a multi-pole, multi-throw switch.

6. The apparatus of claim 1, wherein the RF input signal has a selected signal format among a plurality of signal formats, the plurality of signal formats including at least one of a Gaussian Minimum Shift Keying (GMSK) format, an Enhanced Data rates for GSM Evolution (EDGE) format, a Long Tenn Evolution (LTE) format, a High-Speed Uplink Packet Access (HSUPA) format, an Evolved High-Speed Packet Access (HSPA+) format, and a Universal Mobile Telecommunications System (UMTS) format.

7. The apparatus of claim 6, wherein when the selected signal format is the GMSK format, then the control signal causes the signal distribution device to connect its input to the first output that is connected to the input of the third RF amplification device, and when the selected signal format is one of: (1) the EDGE format; and (2) the UMTS format, then the control signal causes the signal distribution device to connect its input to one of its second outputs that is not connected. to the input of the third RF amplification device.

8. The apparatus of claim 1, futher including:
a first impedance matching network provided between the outputs of the first and second RF amplification devices and the input of the signal distribution device; and
a second impedance matching network provided between the first output of the signal distribution device and the input of the third RF amplification device.

9. The apparatus of claim 1, further comprising:
a second input port for receiving a second RF input signal;
a fourth RF amplification device having an input for being connected. to the second input port, having an output, and having a fourth gain, the fourth RF amplification device configured to operate in a linear amplification mode in response to the RF input signal;
a fifth RF amplification device having an input for being connected to the second input port, having an output, and having a fifth gain, the fifth RF amplification device being configured to operate in a linear amplification mode in response to the RF input signal;
a sixth RF amplification device having an input and having an output, the sixth RF amplification device being configured to operate in a saturated amplification mode in response to an amplified second RF input signal received from the one of the fourth and fifth RF amplification devices; and
a second signal distribution device having an input connected to the outputs of the fourth and fifth RF amplification devices for receiving the amplified second RF input signal, and having a plurality of outputs including a first output connected to the input of the sixth RF amplification device and one or more second outputs that are not connected to the input of the sixth RF amplification device, the second signal distribution device being configured to selectively connect its input to one its outputs in response to a control signal;
wherein when the second RF input signal is to he amplified in the saturated amplification mode by the apparatus, the control signal causes the second signal distribution device to connect its input to its first output that is connected to the input of the sixth RF amplification device, and when the RF input signal is to be linearly amplified by the apparatus, the control signal causes the second signal distribution device to connect its input to one of its second outputs, and
wherein the first RF input signal has a frequency in a lower band of frequencies, and the second RF input signal has a frequency in an upper band of frequencies that are higher than the lower band of frequencies, and
wherein only one of the first and second RF input signials are applied respectively to the first and second input ports at a time.

10. The apparatus of claim 9, wherein the lower band of frequencies includes frequencies below 1400 MHz and the upper band of frequencies includes frequencies greater than 1400 MHz.

11. The apparatus of claim 1, further including means for selectively disabling one of the first and second RF amplification devices, wherein the means includes one of:

a switching apparatus connected to the inputs of the first and second RF amplification devices; and means for selectively disabling a power supply from supplying a current to the first and second RF amplification devices.

12. The apparatus of claim 1, wherein the RF input signal has a selected signal format among a plurality of linear signal formats.

13. A device, comprising:

an input port for receiving an RF input signal having a signal format selected from among a plurality of signal formats, wherein the signal formats include a plurality of linear amplification signal formats for linear amplification by the device, and at least one saturated amplification signal format to be amplified in saturation by the device;

at least a first output and a second output;

a first amplification path from the input port to the first output that includes one or more first RF amplifiers that operate in a linear amplification mode with respect to the RF input signal;

a second amplification path from the input port to the second output that includes at least one of the first RF amplifiers, and at least a second RF amplifier that operates in a saturated amplification mode with respect to the RF input signal; and a path selection device configured to selectively pass the RF input signal through the first amplification path when the signal format of the RF input signal is one of the linear amplification signal formats, and to selectively pass the RF input signal through the second amplification path when the signal format of the RF input signal is the saturated amplification signal format.

14. The device of claim 13, wherein the signal formats include at least one of a Gaussian Minimum Shift Keying (GMSK) format, an Enhanced Data rates for GSM Evolution (EDGE) format, a Long Term Evolution (LTE) format, a High-Speed Uplink Packet Access (HSUPA) format, an Evolved High-Speed Packet Access (HSPA+) format, and a Universal Mobile Telecommunications System (UMTS) format.

15. The device of claim 14, wherein when the selected signal format is the GMSK format, then the path selection dovice passes the RF input signal through the first amplification path, and when the selected signal format is one of: (1) the EDGE format; and (2) the UMTS format, then the path selection device passes the RF input signal through the second amplification path.

16. The device of claim 13, further comprising:

a second input port for receiving a second RF input signal having a signal format selected from among a plurality of signal formats, wherein the signal formats include the plurality of linear amplification signal formats for linear amplification by the device, and the at least one saturated amplification signal format to be amplification in saturation by the device;

at least a third output and a fourth output;

a third amplification path from the second input port to the third output that includes one or more third RF amplifiers that operate in a linear amplification mode with respect to the second RF input signal;

a fourth amplification path from the second input port to the fourth output that includes at least one of the third RF amplifiers, and at least a fourth RF amplifier that operates in a saturated amplification mode with respect to the second RF input signal; and a second path selection device configured to selectively pass the second RF input signal through the third amplification path when the signal format of the second RF input signal is one of the linear amplification signal formats, and to selectively pass the second RF input signal through the fourth amplification path when the signal format of the second RF input signal is the saturated amplification signal format, wherein the first RF input signal has a frequency in a lower band of frequencies, and the second RF input signal has a frequency in an upper band of frequencies that are higher than the lower band of frequencies, and wherein only one of the first and second RF input signals are applied respectively to the first and second input ports at a time.

17. The device of claim 13, Wherein the RF input signal has a selected signal format among a plurality of linear signal formats.

18. A device, comprising:

an input port for receiving an RF input signal having a signal fort at selected from among a plurality of signal formats, wherein the signal formats include a plurality of linear amplification signal formats for linear amplification by the device, and at least one saturated amplification signal format to be amplified in saturation by the device;

at least a first output and a second output;

a first amplification path from the input port to the first output that includes one or more first RF amplifiers that operate in a linear amplification mode with respect to the RF input signal;

a second amplification path from the input port to the second output that includes at least one of the first RF amplifiers, and at least a second RF amplifier that operates in a saturated amplification mode with respect to the RF input signal; and a path selection device configured to selectively pass the RF input signal through the first amplification path when the signal format of the RF input signal is one of the linear amplification signal formats, and to selectively pass the RF input signal through the second amplification path when the signal format of the RF input signal is the saturated. amplification signal format, wherein the first amplification path includes two RF amplifiers connected in series in a signal path between the input port and the path selection device.

19. The device of claim 18, wherein the first amplification path further includes another RF amplifier disposed in a signal path between the input port and the path selection device.

20. The device of claim 19, further including means for selectively disabling one of: (1) the two RF amplifiers connected in series; and (2) the other RF amplifier, wherein the means includes one of:

an input switching apparatus connected to the inputs of: (1) the two RF amplifiers connected in series; and (2) the other RF amplifier; and means for selectively disabling a power supply from supplying a current to one of (1) the two RF amplifiers connected in series; (2) the other RF amplifier.

* * * * *